United States Patent [19]
McGinniss

[11] 3,876,519
[45] Apr. 8, 1975

[54] PROCESS FOR PHOTOPOLYMERIZING "ETHYLENICALLY UNSATURATED PIGMENTED VEHICLES USING A THIOXANTHONE-HALOGENATED NAPHTHALENE SENSITIZER SYSTEM"

[75] Inventor: Vincent Daniel McGinniss, Valley City, Ohio

[73] Assignee: SCM Corporation, Cleveland, Ohio

[22] Filed: May 4, 1973

[21] Appl. No.: 357,479

[52] U.S. Cl. ....... 204/159.24; 96/115 P; 117/93.31; 204/159.14; 204/159.15; 204/159.19; 260/2.5 B; 260/42.18; 260/42.43; 260/42.47; 260/42.49; 260/42.52; 260/77.5 CR; 260/80.81; 260/80.73; 260/86.1 E; 260/837 R; 260/856

[51] Int. Cl. .......................... C08d 1/00; C08f 1/00

[58] Field of Search .............. 204/159.24; 96/115 P

[56] References Cited

UNITED STATES PATENTS

| | | | |
|---|---|---|---|
| 3,702,812 | 11/1972 | McGinniss | 204/159.24 |
| 3,717,558 | 2/1973 | McGinniss | 204/159.24 |
| 3,759,809 | 9/1973 | Carlick et al. | 204/159.23 |
| 3,787,212 | 1/1974 | Heimsch et al. | 204/159.24 |

*Primary Examiner*—Murray Tillman
*Assistant Examiner*—Richard B. Turer
*Attorney, Agent, or Firm*—M. H. Douthitt; S. I. Khayat

[57] ABSTRACT

Ultraviolet polymerization of pigmented photopolymerizable binders or vehicles is improved by incorporating thereinto a sensitizer composition comprising a thioxanthone and an activated halogenated naphthalene compound.

5 Claims, No Drawings

PROCESS FOR PHOTOPOLYMERIZING "ETHYLENICALLY UNSATURATED PIGMENTED VEHICLES USING A THIOXANTHONE-HALOGENATED NAPHTHALENE SENSITIZER SYSTEM"

CROSS REFERENCE TO RELATED APPLICATIONS

The present patent application is related to my copending patent applications Serial Nos. 323,031; 323,087 and 323,088 all of which bear the same filing date of Jan. 12, 1973 now U.S. Pat. Nos. 3,827,957; 3,827,956 and 3,827,958.

BACKGROUND OF THE INVENTION

1. Field of the Invention

The present invention is concerned with the ultraviolet polymerization of pigmented photopolymerizable binders and vehicles, which polymerization is enhanced considerably by the incorporation of certain sensitizers into said binders.

2. Description of the Prior Art

It is known that the photopolymerization of ethylenically unsaturated monomers can be initiated by exposure to various sources of radiation such as ultraviolet radiation. For example, methyl acrylate on long standing in sunlight will generally transform into a transparent mass. Use of sunlight or sources of comparable energy to photopolymerize monomers or combination of monomers, oligomers, etc., is not practical because of very slow rates of polymerization. Improved rates can be induced by applying thermal energy, particularly in combination with free radical promoting catalysts. Thermal energy or heat for this purpose has been supplied by conventional convection ovens and radiant heat from sources such as infrared lamps to effect the desired rate of polymerization. However, for many applications and especially in the coating arts, heat for curing purposes is no longer satisfactory because (1) it is still slow; (2) it cannot be used with heat sensitive substrates; and (3) if often requires use of a volatile solvent which can be a potential air pollutant and costly to recycle.

To enhance the rate of polymerization of ethylenically unsaturated organic compounds by exposure to radiation such as ultraviolet photoiniators or photosensitizers are included with said organic compounds. For clarity, the term photopolymerizable composition as understood herein refers to that composition which hardens (cures) upon exposure to radiation and which can be a vehicle or a binder for use in surface coatings such as paint, varnish, enamel, lacquer, stain or ink. Typical photosensitizers have been benzenesulfonyl chloride, p-toluenesulfonyl chloride, naphthalenesulfonyl chloride, zinc and cadium sulfides, and sulfinic and phosphinic compounds. These prior art sensitizers however have not been completely satisfactory particularly in photopolymerizable compositions which contain pigments. In this respect it is believed that most pigments absorb or mask a substantial proportion of the radiation, often rendering the remainder incapable to energize the sensitizer sufficiently to generate the requisite amount of free radicals to initiate the desired rate of polymerization.

Typical sources for ultraviolet radiation include a number of commercial units such as electric arc lamps, plasma arc torch (see U.S. Pat. No. 3,364,387) and even lasers having a lasing output in the ultraviolet spectrum (see copending application of de Souza and Buhoveckey Ser. No. 189,254). The subject matter of the aforementioned patent applications are incorporated herein by reference.

Advantages of the instant invention over the prior proposals include economical and efficient utilization of ultraviolet energy especially in wavelengths between 3200 and 4000 A to perform "cold" polymerization (curing) of the binders or vehicles at very short exposure times with attendant suppression of losses due to volatilization of components of paint, suppression of discoloration or degradation of resulting deposits which can be generally considered as films, and avoidance of shrinkage and distortion (preservation of dimentional stability) and suppression of degradation of substrate to which the polymerizable vehicle is applied particularly when such substrate is paper, fabric or plastics.

SUMMARY OF THE INVENTION

In accordance with the present invention, there is provided a process for the photopolymerization of ethylenically unsaturated organic compounds including monomers, oligomers, and polymers, which process comprises subjecting to a source of ultraviolet radiation having wavelengths of about 1,800 to 4,000 A a composition comprising a photopolymerizable binder, a pigment and a sensitizer consisting essentially of a thioxanthone and an activated halogenated naphthalene compound. The proportion in the sensitizer is 1 part thioxanthone to 0.66 to 15 parts of the naphthalene. The pigment which can be organic or inorganic in nature can be present up to about 50% by weight of the entire composition, or in terms of the binder, pigment-to-binder ratios can be from 1:10 up to 1:1.

DETAILED DESCRIPTION OF THE INVENTION

The sensitizer, also referred to as the photoinitiator, composition of the present invention comprises two basic components: (1) a thioxanthone and (2) an activated halogenated naphthalene compound. By thioxanthone I mean a class of aromatic compounds represented by the formula:

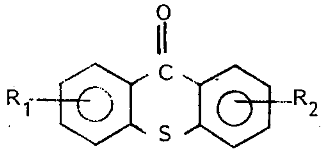

wherein $R_1$ and $R_2$ which can be like or unlike are H, Cl, Br, OH, $NH_2$, or lower alkyls. It should be noted that each of $R_1$ and $R_2$ represents one or more of the indicated substitutents. Representative thioxanthones in addition to thioxanthone itself include 2-Chlorothioxanthone, 2-bromothioxanthone, 6-Chlorothioxanthone, 2,6-dichlorothioxanthone, 6-bromothioxanthone, 2,6-dibromothioxanthone, 2-hydroxythioxanthone, 2-aminothioxanthone, 2-methyl thioxanthone, 2,4-dimethyl thioxanthone, 2-ethyl thioxanthone, 2-chloro-6-methyl thioxanthone, and 2-Chloro-6-ethyl thioxanthone. Thioxanthone is commercially available and so are some of the aforementioned derivatives. Preparative routes involving thiosalicyclic acid and reagents such as benzene, toluene, chloro benzene, etc., were followed, for convenience, to synthesize few of the derivatives, however.

As to the second basic component, it is activated halogenated naphthalene which can be represented by the following formula:

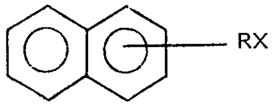

wherein RX represents an active halogen containing radical selected from halosulfonyl, α-haloalkyl, and α-haloalkylated aryls. For efficiency and economy the halo group is preferably chloro or bromo. In the case of sulfonyl halides the naphthalene compound is limited to naphthalene sulfonyl chloride. For the others, it is essential that at least one chloro- or bromo- radical be present on the carbon alpha with respect to the naphthalene nucleus as demonstrated below:

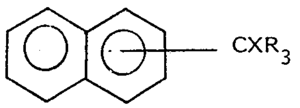

wherein X is the halogen (Cl, Br) and $R_3$ constitutes the remainder of the alkyl or alkylated aromatic group.

Representative naphthalene compounds are naphthalene sulfonyl chloride, α-chloromethyl naphthalene, α-bromomethyl naphthalene, α-chloroethyl naphthalene, and α-bromoethyl naphthalene. These compounds are available commercially and, if desired, can be prepared conveniently by known procedures involving chlorosulfonation or haloalkylation.

The needed proportion of one or both components of the sensitizer composition of the present invention can be incorporated directly into the binder as a unit of a further polymerizable monomer, oligomer, prepolymer, or polymer. In such instance, for example, the sensitizer compound has a reactable functional group on it such as a carboxyl group or a hydroxyl group. Thus each sensitizer compound can be made to react with a further polymerizable material, e.g., glycidyl acrylate, either in monomeric form or already part of a preformed prepolymer or oligomer.

The two basic components are present generally from about 0.5 to 4% for the thioxanthone and 0.3 to 6.0% of the naphthalene compound, the percentage being based on the total weight of pigmented composition. Preferably, these components are incorporated to the extent of 1–3% by weight for the thioxanthone and 0.5–2.5% by weight for the naphthalene compound.

Typically the vehicles can constitute the entire deposit or a binder for solids to yield a cured product in the nature of a paint, varnish, enamel, lacquer, stain or ink. Usually the vehicles are fluid at ordinary operation temperatures (between about 30° and about 300°F. and advantageously between ordinary room temperature and about 180°F.), and when polymerized by the U.V. radiation, give a tack-free film or deposit that is durable enough for ordinary handling. In the cured state such vehicle is resinous or polymeric in nature, usually crosslinked. Uncured for application to a substrate or uncured on such substrate, such vehicle consists essentially of a monomer or mixture of monomers, or a further polymerizable oligomer, prepolymer, resin, or mixture of same, or a resinous material dispersed or dissolved in a solvent that is copolymerizable therewith. Such solvent ordinarily is monomeric, but can be an oligomer (i.e., up to 4 monomer units connected) or prepolymer (mol weight rarely above about 2,000). Oligomers and prepolymers should be understood herein as being polymeric in nature.

Suitable ethylenically unsaturated compounds which are photopolymerizable with the aid of the above photoinitiators include the various vehicles or binders which can be reactive vinyl monomers such as the lower alkyl esters of acrylic and methacrylic acids or polymer and prepolymers. Vinyl monomers particularly adapted for photopolymerization include methylmethacrylate, ethylmethacrylate, 2-ethylhexyl methacrylate, butylacrylate, isobutyl methacrylate, the corresponding hydroxy acrylates; e.g., hydroxy ethylacrylate, hydroxy propyl acrylate, hydroxy ethylhexyl acrylate, also the glycol acrylates; e.g., ethylene glycol dimethacrylate, hexamethylene glycol dimethacrylate, the allyl acrylates; e.g., allyl methacrylate, diallyl methacrylate, the epoxy acrylates; e.g., glycidyl methacrylate; and the aminoplast acrylates; e.g., melamine acrylate. Others such as vinyl acetate, vinyl and vinylidene halides and amides, e.g., methacrylamide, acrylamide, diacetone acrylamide, butadiene, styrene, vinyl toluene, and so forth are also included.

It should be noted that the sensitizers of the present invention not only contribute to the rapid curing of the coating surface, but also to the depth of cure which is quite practical that the resultant polymerized deposit resists scratching or disruption when it is first ostensibly "dry" on the surface. Curing can continue on stored pieces. Typical film thickness for the deposit can be about 0.1 to as high as 10 mils. Preferred cured deposits are continuous films, but decorative or message-transmitting ones need not be.

Typically the substrate workpieces coated with the uncured deposit or deposits are passed under a U.V.-providing light beam by a conveyor moving at predetermined speeds. The substrate being coated can be metal, mineral, glass, wood, paper, plastic, fabric, ceramic, etc.

A distinct advantage of the present invention is that many useful pigments can be incorporated, in modest proportions, into the vehicle without much deleterious effects. Thus, opacifying pigments such as zinc oxide can be used quite well. Titania, e.g., anatase and particularly rutile, can also be used with ease even though it makes for a much more difficult film to cure by U.V. radiation. Other filler materials and coloring pigments such as basic lead sulfate, magnesium silicate, silica, clays, wollastonite, talcs, mica, chromates, iron pigments, wood flour, microballoons, hard polymer particles, and even reinforcing glass fiber or flake also are suitable in the vehicle to make a paint. Generally little to no pigments are used in photopolymerizable vehicles because of the attendant difficulty of rapid curing. It is believed that pigment particles tend to absorb the bulk of the useful ultraviolet radiation leaving only a minor portion of said radiation to energize the sensitizers and generate the requisite amount of necessary free radicals. This is particularly true in the case of rutile-type pigments.

The fact that my sensitizer composition functions in the presence of pigments is quite surprising and unexpected. By itself, the naphthalene compound, i.e., naphthalene sulfonyl chloride, α-chloromethyl naphthalene, etc., is well known as a photoinitiator in non-pigmented systems (clears). In the presence of pigments, and especially of the rutile type, the naphthalene compound fails measurably, giving substantially no photoinitiation activity even with repeated exposures to the ultraviolet source. As to the thioxanthone it provides little to no photoinitiation for both pigmented or clear systems.

As stated earlier, the reason the naphthalene compound fails as a photoinitiator in pigmented systems (pigment-to-binder ration being 1:10 to 1:1) is largely due to the pigment's masking effect. It is believed that in order for the naphthalene compound to function as a photoinitiator it should be subjected to (so it can absorb) ultraviolet radiation having wavelengths between 2,000 and 3,300 A. Generally, most pigments tend to absorb the substantial portion of the U.V. spectrum, i.e., 2,000 to 4,000 A, leaving little, if any, for energizing the naphthalene compound.

The problem of the pigment's masking effect has been overcome successfully by my present sensitizer composition. Without being bound by theory, the mechanism by which my sensitizer composition functions is based on the difference in triplet energy between the thioxanthone and the naphthalene compound. It is postulated that the thioxanthone with its relatively high triplet energy ($E_t \approx 65$ K cal/mol) absorbs U.V. radiation in the range 2000 to 4200 A and then transfers a substantial portion of this absorbed energy to the naphthalene compound (triplet energy $E_t \cong 61$ K cal/mol) which, in effect, is the photoinitiating sensitiver. I have found also that differences in triplet energy between the two components are preferably not greater than about 6.0 K cal/mole. A number of U.V. curing experiments was conducted wherein the sensitizer composition comprised two components having a wide range of triplet energies only to discover that the rate of photopolymerization was always inferior to my composition. Often the selected sensitizers could not even function in pigmented vehicles.

The following examples show ways in which this invention has been practiced, but should not be construed as limiting it. Unless otherwise specifically stated herein, all parts are parts by weight, all percentages are weight percentages and all temperatures are in degrees Fahrenheit. Where the binder being cured is of the type normally curable by free-radical polymerization, it is sometimes advantageous for completeness of cure and speed to maintain a substantially inert atmosphere above the irradiated workpiece. Generally this is effected by maintaining a purge of nitrogen or other inert gas or placing a thin film of completely transparent polyethylene over the workpiece.

EXAMPLE 1

A number of acrylic resins and combinations thereof were utilized in evaluating the photoinitiator of the present invention. For convenience, the polymerizable binder composition comprised three acrylic resins in equal proportions. These resins were acrylic monomers, diacrylate and triacrylate oligomers.

A polymerizable composition consisting of one-third 2-ethylhexyl acrylate, one-third ethylene glycol diacrylate, and one-third trimethylolpropane triacrylate was prepared with various photoinitiators in accordance with the present invention. To each composition was added conventional pigment and at various pigment-to-binder ratios ranging from 0.2 to 0.9 parts pigment per 1 part binder. The pigment was dispersed within the binder in a conventional manner.

Each sensitized binder composition was poured over a pair of steel panels and drawn down with a No. 8 wound wire rod to a film thickness or coating of approximately 0.5 mil. The coated but wet panels were each exposed to a different source of ultraviolet light; one provided from a plasma arc radiation source (PARS) and the other a conventional ultraviolet light supplied by Ash Dee Corporation, said light having two 4,000 watt mercury lamps. Exposure times were from 0.07 sec. to 30 secs., with the panels being placed approximately 5 inches from the ultraviolet source. These exposure times are calculated from the speed of the conveyor belt on which the panels are placed. For example, a speed rate of 300 feet per minute corresponds to 0.07 second exposure time, whereas the speed of approximately 86 to 100 feet per minute corresponds to 0.2 seconds. The photopolymerization was done in an inert atmosphere (blanket of nitrogen gas).

In Table I there are shown the results of exposing panels coated with various combinations of pigment-to-binder ratios and which also included prior art photoinitiators and those of the present invention. Under the column designated "cure," the nature of the finished or cured films is described. For example, tacky indicates that the film is still soft to the touch; i.e., incomplete polymerization. The term, hard, on the other hand indicates full cure.

TABLE 1

| PHOTOINITIATOR % wt. | PIGMENT & PIGMENT-TO-BINDER RATIO | U.V. SOURCE | TIME Sec. | CURE |
|---|---|---|---|---|
| 1-Chloromethyl naphthalene, 2% | Rutile $TiO_2$ (0.5) | PARS | 0.2 | Tacky and Wet |
| 1-Chloromethyl naphthalene, 4% | Rutile $TiO_2$ (0.5) | PARS | 0.2 | Tacky and Wet |
| 1-Chloromethyl naphthalene, 2% | Rutile $TiO_2$ (0.5) | Conventional | 7 | Tacky and Wet |
| 1-Chloromethyl naphthalene, 2% | Rutile $TiO_2$ (0.5) | PARS | 10 | Tacky and Wet |
| 10-Thioxanthone, 2% | Rutile $TiO_2$ (0.5) | PARS | 0.2 | Wet |
| 2-Acetophenone sulfonyl chloride, 2% | Rutile $TiO_2$ (0.5) | PARS | 0.2 | Wet |
| 10-Thioxanthone, 2% | Rutile $TiO_2$ (0.5) | Conventional | 7 | Wet |
| 1-Chloromethyl naphthalene, 2% thioxanthone, 1% | Rutile $TiO_2$ (0.5) | PARS | 0.2 | Hard |

TABLE 1 – Continued

| PHOTOINITIATOR % wt. | PIGMENT & PIGMENT-TO-BINDER RATIO | U.V. SOURCE | TIME Sec. | CURE |
|---|---|---|---|---|
| 1-Chloromethyl naphthalene, 2% thioxanthone, 1% | Rutile $TiO_2$ (0.5) | PARS | 0.2 | Hard |
| 1-Chloromethyl naphthalene, 2% thioxanthone, 1% | Rutile $TiO_2$ (0.7) | PARS | 0.2 | Hard |
| 1-Chloromethyl naphthalene, 2% thioxanthone, 1% | Rutile $TiO_2$ (0.9) | PARS | 0.2 | Hard |
| 1-Chloromethyl naphthalene, 2% thioxanthone, 1% | Anatase $TiO_2$ (0.8) | PARS | 0.2 | Hard |
| 1-Chloromethyl naphthalene, 2% thioxanthone, 1% | Anatase $TiO_2$ (0.5) | PARS | 0.07 | Hard |
| 1-Bromomethyl naphthalene, 2% thioxanthone, 1% | Anatase $TiO_2$ (0.5) | PARS | 0.2 | Hard |
| 1-Bromomethyl naphthalene, 2% thioxanthone, 1% | Rutile $TiO_2$ (0.8) | PARS | 0.2 | Hard |
| 1-Bromomethyl naphthalene, 2% thioxanthone, 1% | ZnO (1.0) | PARS | 0.07 | Hard |
| 1-Bromomethyl naphthalene, 2% thioxanthone, 1% | Rutile $TiO_2$ (0.5) | PARS | 0.2 | Hard |

EXAMPLE 2

A "clear" vehicle was prepared first from one-third part pentaerythritol triacrylate, one-third part hydroxyethyl acrylate, and one-third the adduct formed by reacting one mol of toluenediisocyanate with 2 mols of hydroxyethyl acrylate. Anatase $TiO_2$ was incorporated into said clear vehicle to provide a pigment-to-vehicle (binder) ratio of 0.6.

The curing procedure was carried out in the same manner described in Example 1. Without the incorporation of any sensitizers no curing (hardening) of the coated film (0.5 mil) was observed even with repeated exposures to the U.V. source. (Panels coated with the pigmented vehicle to about 0.5 mil thickness are passed under the PARS U.V. radiation source at line speeds of 100 feet per minute for 100 consecutive times without any observable curing).

Naphthalene sulfonyl chloride to the extent of 2% by weight of said vehicle, and 10-thioxanthone to the extent of 1.0% by weight were incorporated into the above-described pigmented vehicle and dispersed well thereinto. The sensitized pigmented composition was irradiated by the PARS ultraviolet source described in Example 1 at line speeds of 100 feet per minute showing full cure. With conventional ultraviolet the time was 7 sec.

Other pigments were incorporated into the vehicle such as zinc oxide, iron black, copper phthalocyanine blues and greens all resulting in the same hard cure after comparable exposure times.

EXAMPLE 3

A "clear" vehicle was prepared from one-half trimethylolpropane triacrylate and one-half 2-ethylhexylacrylate. Into said vehicle was incorporated separately (with pigment-to-vehicle ratio of 0.5) a series of pigments, i.e., rutile $TiO_2$, anatase $TiO_2$, iron black, antimony oxide, lead basic sulfate, and copper phthalocyanine greens. Into said sample was incorporated 2% by weight of naphthalene sulfonyl chloride and 1.0% by weight of αchloromethyl naphthalene. The samples were reduced to films (0.4 mil) on aluminum panels and irradiated with PARS U.V. source at a line speed of 100 ft/min. (0.2 sec.). No satisfactory cure was shown even after 100 repeated exposures. When one of the naphthalene compounds was replaced with thioxanthone full cure was obtained. This was true of all the pigmented vehicles described.

EXAMPLE 4

A "clear" vehicle was prepared from one-third ethylhexyl acrylate, one-third trimethylolpropane triacrylate and one-third "DER 332" diacrylate (prepared by reacting at 120°C. 2 moles of acrylic acid with "DER 332" in the presence with 0.2% by weight benzyl dimethylamine, as a catalyst. The adduct formed is cooked at 120°C. until almost zero acid number is obtained. "DER 332" is a trademark of Dow Chemical Co., Midland, Mich. for an epoxy reaction product produced from one mole of Bisphenol A and two moles of epichlorohydrin). Rutile $TiO_2$ was added to the vehicle until P/B (pigment-to-binder) ratio of 0.8/1 was attained.

Table II lists the various sensitizer systems incorporated into the above-described vehicle and the curing times corresponding to the particular source of ultraviolet radiation, be it PARS or Conventional. Again times were calculated from line speeds carrying the panels coated with the sensitized vehicles.

TABLE II

| NO. | PHOTOSENSITIZER COMPOSITIONS A, % wt. | B, % wt. | U.V. SOURCE | TIME SEC. | CURE |
|---|---|---|---|---|---|
| 1. | α-Chloromethyl naphthalene, 2.0 | 10-thioxanthone, 1.0 | PARS | 0.2 | Hard |
| | | | Conventional | 7.0 | Hard |
| 2. | α-bromomethyl naphthalene, 2.0 | 10-thioxanthone, 1.0 | PARS | 0.2 | Hard |
| | | | Conventional | 7.0 | Hard |
| 3. | naphthalene sulfonyl chloride, 2.0 | — | PARS | 2.0 | Wet |
| | | | Conventional | 7.0 | Wet |
| 4. | naphthalene sulfonyl chloride, 2.0 | 2-chlorothioxanthone, 1.0 | PARS | 0.1 | Hard |
| | | | Conventional | 7.0 | Hard |
| 5. | naphthalene sulfonyl chloride, 2.0 | 6-chlorothioxanthone, 1.0 | PARS | 0.1 | Hard |
| | | | Conventional | 7.0 | Hard |
| 6. | naphthalene sulfonyl chloride, 2.0 | anthraquinone, 1.0 | PARS | 0.2 | Tacky |
| | | | Conventional | 7.0 | Tacky |
| 7. | benzophenone, 2.0 | anthraquinone, 1.0 | PARS | 0.2 | Wet |
| | | | Conventional | 7.0 | Wet |

EXAMPLE 5

To the clear vehicle of Example 4 was added separately the following pigments: $TiO_2$ (anatase), copper phthalocyanine blues and greens, zinc oxide, and iron oxide. Now into each pigmented vehicle (P/B = 0.8/1) was incorporated 2.0% by weight of naphthalene sulfonyl chloride and 1.0% of 2-chloro, 6-methylthioxanthone. After exposure to both PARS and Conventional U.V. radiation the pigmented vehicles showed full cure after 0.07 sec. and 7.0 sec., respectively.

EXAMPLE 6

Repeating the same procedure of Example 5, except 1.5% of the naphthalene compound and 1.5% of the thioxanthone compound were incorporated. The results showed no detectable change.

EXAMPLE 7

Repeating the same procedure of Example 5 except the naphthalene compound was changed to α-bromoethyl naphthalene (2.0%). The same excellent results were obtained.

EXAMPLE 8

Repeating the same procedure of Example 5 except the naphthalene compound was chlorosulfonated at two sites. Again the same excellent results was obtained.

What is claimed is:

1. A process for photopolymerizing a polymerizable vehicle selected from ethylenically unsaturated monomers, oligomers, prepolymers, or mixtures thereof, by exposure to ultraviolet radiation, said vehicle having dispersed therein an opacifying pigment in the amount of about 0.2 to 0.9 parts to 1.0 part vehicle, which comprises incorporating into said vehicle an ultraviolet sensitizer proportion consisting essentially of (1) a thioxanthone compound of the formula:

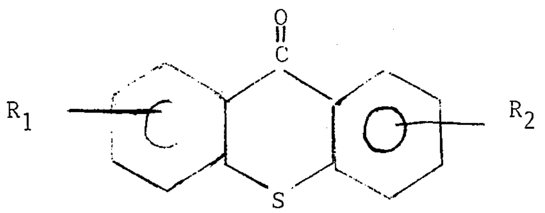

wherein $R_1$ and $R_2$ which can be like or unlike are H, Cl, Br, OH, $NH_2$ or lower alkyl, and (2) an activated halogenated naphthalene compound; and wherein said thioxanthone being present from about 0.5 to 4% by weight, and said naphthalene compound being present from about 0.3 to 6.0% by weight, based on the weight of the vehicle.

2. The process of claim 1 wherein said activated halogenated naphthalene compound is selected from the group consisting of naphthalene sulfonyl chloride, naphthalene disulfonyl chloride, alpha-halo methyl naphthalene, alpha-halo ethyl naphthalene, —and mixtures thereof.

3. The process of claim 1 wherein the opacifying pigment is selected from titanium dioxide, zinc oxide, ferric oxide and organo-metallic pigments.

4. The process of claim 1 wherein said halo-substituted thioxanthone is selected from the group consisting of 2-chlorothioxanthone, 2,6-dichlorothioxanthone, 2,6-dibromothioxanthone.

5. The process of claim 1 wherein said alkyl-substituted thioxanthone is selected from the group consisting of 2-methylthioxanthone, 2,4-dimethylthioxanthone, 2-ethylthioxanthone.

* * * * *